United States Patent
Tsuto

[19]

[11] Patent Number: 6,138,259
[45] Date of Patent: *Oct. 24, 2000

[54] SEMICONDUCTOR MEMORY TESTING APPARATUS

[75] Inventor: Masaru Tsuto, Saitama, Japan

[73] Assignee: Advantest Corporation, Tokyo, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/953,518

[22] Filed: Oct. 17, 1997

[30] Foreign Application Priority Data

Oct. 18, 1996 [JP] Japan .................. 8-275963

[51] Int. Cl.[7] .................................................. G01R 31/28
[52] U.S. Cl. ........................................... 714/738; 714/25
[58] Field of Search ................... 371/27.1, 21.2, 371/22.33, 22.4, 22.6, 25.1, 27.6, 27.7; 395/183.17, 183.18, 183.19, 500.05; 364/550, 580; 324/765, 76.11; 714/25, 27, 31, 32, 39, 48, 719, 720, 734, 735, 738; 365/201

[56] References Cited

U.S. PATENT DOCUMENTS

| | | | |
|---|---|---|---|
| 5,390,192 | 2/1995 | Fujieda | 371/27 |
| 5,432,797 | 7/1995 | Takano | 371/27 |
| 5,461,310 | 10/1995 | Cheung et al. | 324/158.1 |
| 5,481,671 | 1/1996 | Fujisaki | 395/182.06 |
| 5,579,251 | 11/1996 | Sato | 364/579 |
| 5,604,756 | 2/1997 | Kawata | 371/67.1 |
| 5,629,946 | 5/1997 | Takano | 371/27 |
| 5,646,948 | 7/1997 | Kobayashi et al. | 371/21.2 |
| 5,682,390 | 10/1997 | Housako et al. | 371/21.3 |
| 5,682,393 | 10/1997 | Ohsawa | 371/27 |
| 5,790,559 | 8/1998 | Sato | 371/21.3 |
| 5,796,748 | 8/1998 | Housoko et al. | 371/21.3 |

*Primary Examiner*—Nadeem Iqbal
*Attorney, Agent, or Firm*—Staas & Halsey LLP

[57] ABSTRACT

In a semiconductor memory testing apparatus for testing a DRAM which requires a refresh operation, plural pattern generation parts are operated normally to generate high-speed pattern signals. The plural pattern generation parts are connected to a common sequence control part and controlled by the count value of the same program counter so that they branch to the refresh mode, operate in the refresh mode a plurality of number of times, then return to the main routine and resume the generation of pattern data.

19 Claims, 14 Drawing Sheets

MAIN ROUTINE

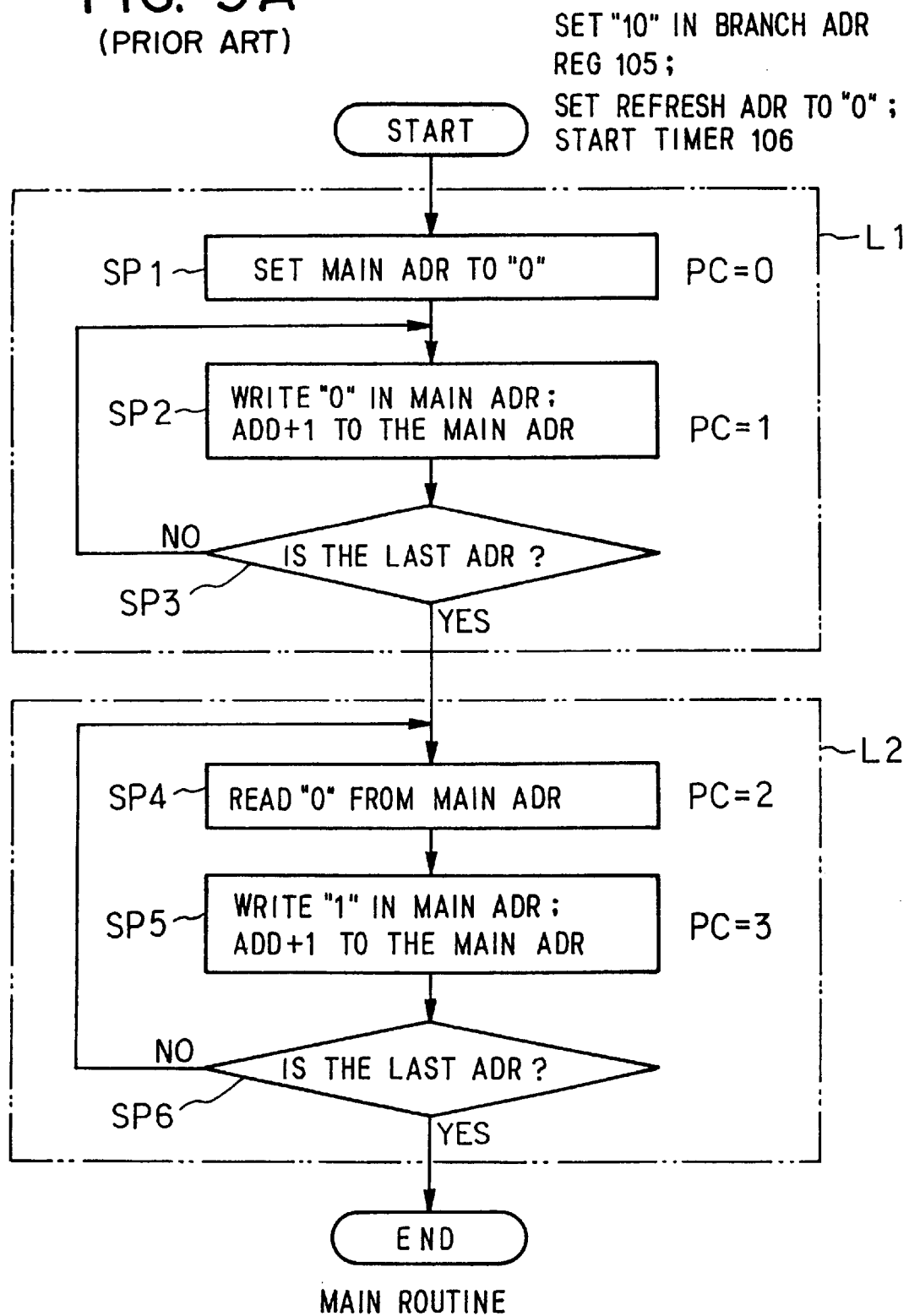

REFRESH ROUTINE

SEMICONDUCTOR MEMORY TESTING APPARATUS

BACKGROUND OF THE INVENTION

1. Field of the Invention

The present invention relates to a semiconductor memory testing apparatus for testing memories formed by semiconductor integrated circuits and, more particularly, to an improved semiconductor memory testing apparatus which is provided with a plurality of pattern generators and capable of testing high-speed semiconductor memories in addition to normal speed semiconductor memories.

2. Description of the Related Art

Writable/readable memories such as RAMs (random access memories) are mostly formed by semiconductor integrated circuits (ICS). Roughly speaking, conventional semiconductor memory testing apparatus for testing such memories formed by semiconductor ICS (which memories will hereinafter be referred to as semiconductor memories) comprises a timing generating part 14, a pattern generator 11, a waveform shaping part 12, a logical comparison part 13 and a failure analysis memory.

The timing generating part 14 supplies a reference clock, which functions as a timing signal, to the pattern generator 11, the waveform shaping part 12 and the logical comparison part 13 to control their operations. The pattern generator 11 responds to the reference clock (the operation or working clock) from the timing generating part 14 to generate address pattern data, test pattern data and so forth to be applied to a semiconductor memory under test DUT, and to generate expected pattern data and the like to be fed to the logical comparison part 13. The waveform shaping part 12 converts such pieces of pattern data (digital signals) from the pattern generator 11 to analog pattern signals having real waveforms for supply to the semiconductor memory under test DUT.

The semiconductor memory under test DUT is controlled by the application thereto of a control signal to write therein or read out thereof the test pattern signals. That is, by the application of a write control signal to the semiconductor memory DUT, the test pattern signals are sequentially written thereinto at addresses specified by address pattern signals, whereas by the application of a readout control signal to the semiconductor memory DUT, the written test pattern signals are sequentially read out of its addresses specified by the address pattern signals.

The response output signal thus read out of the semiconductor memory DUT (hereinafter referred to also as a memory under test DUT) is provided to the logical comparison part 13 for logical comparison with the expected pattern data (a digital signal) output from the pattern generator 11. When a mismatch is found between them, the logical comparison part 13 produces a fail signal indicating the mismatch, i.e. what is called failure data. Usually, the logical comparison part 13 outputs a high logical level "1" (H logic) as the failure data. On the other hand, when a match is found, the logical comparison part 13 yields pass signal indicting the match, i.e. pass data. Since the failure data is logic "1", the logical comparison part 13 outputs low logical level "0" (L logic) as the pass data. The failure data is sent to the failure analysis memory and stored therein. Further, the failure analysis memory is not a prime constituent of the present invention, and hence it is not shown.

The failure analysis memory has the same operation speed and the same storage capacity as does the memory under test and the same address pattern signal as that applied to the memory under test is fed to this failure analysis memory as well. Furthermore, the failure analysis memory is initialized prior to the start of the test. For example, in the case where logic "0" is written into the failure analysis memory at its all addresses by initialization and failure data is provided from the logical comparison part 13 in the test of the memory under test, logic "1" is written into the failure analysis memory at an address specified by the address pattern signal. In other words, failure data (logic "1") indicting a defective or failure memory cell is written into the failure analysis memory at the same address as that of the failure memory cell of the memory under test.

Upon completion of one test cycle, it is decided whether the memory under test is defective or non-defective, taking into account the number of pieces of failure data and their locations stored in the failure analysis memory. For example, in the case of relieving a defective memory, the number of pieces of failure data (positional information of defective or failing memory cells of the memory under test) read out of the failure analysis memory is counted and a decision is made as to whether the detected defective memory cells can be relived by relief means provided in the memory under test.

Conventionally, a semiconductor memory of an operating speed equal to or lower than that of the pattern generator 11 is tested using the semiconductor memory testing apparatus of such a construction as shown in FIG. 6, whereas a high-speed semiconductor memory operable at a speed higher than that of the pattern generator 11 is tested using a semiconductor memory testing apparatus such as depicted in FIG. 7.

As shown in FIG. 7, the semiconductor memory testing apparatus is equipped with plural pattern generators 11A and 11B, two in this example. Pattern data from the pattern generators 11A and 11B are multiplexed by a high-speed conversion part 16 into high-speed pattern data, which is converted by the waveform shaping part 12 into a high-speed pattern signal having a real waveform for application to the memory DUT.

The operation clock (a reference clock) from the timing generating part 14 is applied directly to the waveform shaping part 12 and the logical comparison part 13, but the operation clock is given to the pattern generators 11A and 11B after being frequency divided into ½ in a clock/select signal generating part 15. Consequently, the pattern generators 1A and 11B generate, in response to an operation clock having a frequency of ½ of that of the reference clock (hereinafter referred to as ½ operation clock), such pattern data PA (composed of data A1, A2, A3, ...) and pattern data PB (composed of data B1, B2, B3, ...) as shown in FIGS. 8C and 8D, respectively, which have a period twice longer than that of the reference clock (i.e., a frequency of ½ of that of the latter).

The pattern data PA and PB are supplied to AND gates G1 and G2 at one input terminals thereof, respectively, the AND gates G1 and G2 forming the high-speed conversion part 16. To the other input terminals of the AND gates G1 and G2 are applied from the clock/select signal generating part 15, respectively, select signals SA and SB having a period twice longer than that of the reference clock and their duty factor of one-half (50%) as shown in FIGS. 8A and 8B.

As is evident from FIGS. 8A and 8B, since the select signals SA and SB have the same periods as those of the pattern data PA and PB but each has a duty factor of one-half as mentioned above, the select signals SA and SA each have a pulse waveform in which a high logical level (logic "1") of a duration corresponding to the one-half period of the pattern data is followed by a low logical level (logic "0") of a duration corresponding to the one-half period of the pattern data, and they are shifted in their phase by one-half period. Hence, the AND gates G1 and G2 which are supplied with the select signals SA and SB at one input terminals thereof, respectively, are alternately enabled (ON) and disabled (OFF) at a speed twice higher than the pattern data PA and PB that are fed to the other input terminals of the AND gates.

In the example of FIG. 8, the select signal SB that is applied to the AND gate G2 is delayed by the one-half period relative to the select signal SA that is applied to the AND gate G1; hence, the AND gate G1 permits the passage therethrough of only the first half (½) of each data A1, A2, A3, . . . of the pattern data PA supplied thereto and the AND gate G2 permits the passage therethrough of only the latter half (½) of each data B1, B2, B3, . . . of the pattern data PB supplied thereto. In consequence, an OR gate outputs high-speed pattern data PAB which is an alternation of the first half of each data of the pattern data PA and the latter half of the pattern data PB and has a frequency twice higher than those of the pattern data PA and PB.

The high-speed pattern data PAB that is output from the high-speed conversion part 16 is converted by the waveform shaping part 12 to a high-speed pattern signal having a real waveform, which is applied to the memory DUT. When the data written in the memory pUT is read out therefrom, the high-speed pattern data PAB from the high-speed conversion part 16 is provided as expected pattern data to the logical comparison part 13 for logical comparison with the data read out of the memory DUT to make a decision about whether the memory DUT is defective or non-defective.

Incidentally, various electronic apparatuses including computers mostly employ, as a main memory, a dynamic random access memory commonly called a DRAM. As is well-known in the art, the DRAM has, due to its device construction, a property that stored contents of memory cells disappear unless they are accessed within a certain period of time, and means is needed to refresh the DRAM periodically. On this account, in the case of testing the DRAM, the memory testing apparatus refreshes it at fixed time intervals in addition to the pattern signal write and readout operations that are operations of the main routine. That is, a refresh routine for sequentially accessing memory cells of the DRAM is provided separately of the main routine for testing the function of the DRAM so that the operation branches from the main routine to the refresh one at. regular time intervals and, upon completion of the refresh routine, returns to the main routine.

FIG. 9A schematically shows an example of the main routine and FIG. 9B an example of the refresh routine in the case of testing the DRAM through the use of one pattern generator as shown in FIG. 6.

As depicted in FIG. 9A, when the main routine is started, "10" is set in a branch address storage register and a timer is started which measures the time when to branch to the refresh routine. Now, let it be assumed that the address of the DRAM under test increments one by one, starting at "0" and ending in the largest number. For example, if the DRAM has a total of "1023" addresses, the first address is "0" and the last address "1023". Thus, the address to be refreshed first is the address "0".

The first-half routine L1 surrounded by the chain line indicates the execution of an operation of writing logic "0" in all addresses of the DRAM. In first step SP1 immediately after the start of the main routine, the first main routine address of the DRAM is set at "0". That is, the main routine starts at the address "0".

Next, in second step SP2 the pattern generator is caused to generate pattern data for writing logic "0" in the first address "0"of the DRAM. After the generation of the pattern data, a 1 is added to the first main routine address to provide a state in which logic "0" can be written in the next address "1".

In third step SP3 a check is made to see if the main routine address "1" is the last address of the DRAM. If not, the operation returns to second step SP2, in which the pattern generator is caused to generate pattern data for writing logic "0" in the next main routine address "1" of the DRAM and a 1 is added to the main routine address "1".

Thereafter, second and third steps SP2 and SP3 loop until the main routine address reaches the last address of the DRAM under test. When the main routine address reaches the last address of the DRAM, the operation proceeds to the second-half routine L2 surrounded by the chain line.

The second-half routine L2 begins with step SP4 of reading out of the DRAM the logic "0" written at its first address "0" in the routine L1. Next, in fifth step SP5 the pattern generator is controlled to generate pattern data for writing logic "1" at the first address "0" from which the logic "0" was read out in fourth step SP4, then a 1 is added to the first address "0" from which the logic "0" was read out, and logic "0" is read out of the next main routine address "1" so that logic "1" can be written therein.

In the next sixth step SP6, a check is made to see if the main routine address is the last address of the DRAM under test. If not, then the operation goes back to fourth step SP4 of reading out of the DRAM the logic "0" written at the next main routine address "1", followed by fifth step SP5 wherein thd pattern generator is caused to generate pattern data for writing logic "1" in the main routine address "1" from which logic "0" was read out and then a 1 is added to this address "1".

Thereafter, fourth to sixth steps SP4 to SP6 loop until the main routine address reaches the last address of the DRAM under test. When the main routine address reaches the last address of the DRAM, the second-half routine L2 ends, with which the main routine finishes.

Thus, the second-half routine L2 is a repetition of the operation of reading out logic "0" from each address of the DRAM under test and writing therein logic "1" for each of the first address "0" to the last one ("1023", for instance).

When the timer (started at the start point of the main routine as referred to previously) measures the preset time during the execution of the main routine, an interrupt instruction is issued irrespective of which step of the main routine is being executed and the operation of the main routine shown in FIG. 9A is suspended and then switched to the refresh routine depicted in FIG. 9B.

The refresh routine begins with step SP7, wherein a first refresh address "0" of the DRAM under test, preset at the start of the main routine, is accessed (logic "0" is rewritten) and a 1 is added to the first refresh address "0", permitting access to the next refresh address "1".

Next, a check is made in step SP8 to see if the number of times the refresh operation has been performed reaches a preset value N, where N is the number of addresses that are refreshed at one time and it is usually set at an integral fraction of the sum total of addresses of the DRAM under test. In this example, since the number of addresses is set at 16, it is decided in step SP8 whether the refresh operation is sixteenth.

When steps SP7 and SP8 have looped N times, the operation returns to the main routine of FIG. 9A. At this time, the address refreshed last is stored in a storage part so that when the refresh routine is again branched from the main routine, the refresh operation can be resumed at an address next to that where the preceding refresh operation concluded.

FIG. 10 illustrates in block form the general circuit configuration of the pattern generator 11 with which it is possible to perform the above-described refresh operation. FIG. 11 shows an example of its operation. The pattern generator 11 comprises a sequence control part 100, a pattern generating instruction memory 101 and a pattern generation control part 102. Following a pattern generating instruction that is read out of the pattern generating instruction memory 102 in accordance with the address (a value PC) of the instruction to be executed that is indicated by a program counter 103 of the pattern generator 11, the pattern generation control part 102 outputs pattern data PTNDT (a digital signal) and expected pattern data EXPDT.

What is intended to mean by a "main routine address" in FIG. 11 is the address of an address signal that is output accompanying the pattern data which is generated by the pattern generation control part 102 in FIG. 10 during execution of the main routine of FIG. 9A. A refresh routine address is the address of an address signal that is output accompanying the pattern data PTNDT which is generated by the pattern generation control part 102 during execution of the refresh routine of FIG. 9B.

Steps SP1, SP2, SP4, SP5 and SP7 in FIG. 9 are performed when the value PC indicated by the program counter 103 takes the values PC=0, PC=1, PC=2, PC=3 and PC=10 indicated on the right of the blocks of these steps, respectively. The instructions that are executed by steps SP1, SP2, SP4, SP5 and SP7 are prestored in the pattern generating instruction memory 101 (FIG. 10).

A sequence control instruction memory 104 follows the value PC of the program counter 103 to output sequence control instructions that determine the sequence of pattern generation. These sequence control instructions are prestored in the sequence control instruction memory 104.

A branch address storage register 105 in FIG. 10 is one that stores the value PC to be indicated by the program counter 103 when the instruction of the first box (step SP7) of the refresh routine in FIG. 9B is executed. In the example of FIG. 9B the value PC=10 is stored in the register 105.

A timer 106 in FIG. 10 is a means for measuring the time from the start of the main routine to the branching therefrom of the refresh routine. The timer 106 counts clock pulses output from a timer oscillator 107 and applies an interrupt signal to a synchronization circuit 108 each time the count value reaches a preset value. The synchronization circuit 108 synchronizes the interrupt signal with the clock signal from the timing generating part 14 (FIGS. 6 and 7) and provides it as a branch instruction J to a decode/select part 109.

In the example of FIG. 9, the generation of the pattern data PTNDT is started with the value PC of the program counter 103 set at 0 (PC=0). Thereafter, the instruction that is read out of the sequence control instruction memory 104 following the value PC of the program counter 103 is interpreted in the decode/select part 109, which determines the value PC of the program counter 103 for the next pattern generation cycle, thereby controlling the sequence of pattern generation. The pattern generating instruction is read out of the pattern generating instruction memory 101 in accordance with the value PC of the program counter 103 and the pattern generation control part 102 follows the read-out pattern generating instruction to generate the pattern data PTNDT and the expected pattern data EXPDT.

Upon input thereinto the branch instruction J from the synchronization circuit 108, the decode/select part 109 sets the value PC of the program counter 103 for the next pattern generation cycle at the value prestored in the branch address storage register 105, PC=10 in this example, regardless of the instruction inputted to the decode/select part 109 from the sequence control instruction memory 104. At the same time, the value (step of the main routine) that the program counter 103 ought to indicate in the next pattern generation cycle when it follows an instruction from the sequence control instruction memory 104 is written into a return address storage register 110. In the example of FIG. 11, PC=3 (step SP5) is written in the return address storage register 110 since the branch instruction is issued when the value of the program counter 103 is PC=2 (step SP4).

When the program counter 103 outputs the value PC=10 prestored in the branch address storage register 105, the pattern generating operation of the main routine is suspended and the refresh routine of FIG. 9B is branched.

When the instruction that is provided to the decode/select part 109 from the sequence control instruction memory 104 indicates the completion of the refresh routine during execution of the refresh routine, the value PC of the program counter 103 for the next pattern generation cycle is set at a value stored in the return address storage register 110. Since in this example PC=3 (step SP5) is prestored in the return address storage register 110 as mentioned above, the value PC of the program counter 103 is set at "3" (PC=3). With this, the pattern generating operation returns from the refresh routine to the main routine of FIG. 9A.

The above operations will be further described with reference to FIG. 11. At the same time as the main routine starts, the timer 106 is started. In pattern generation cycle 1, it shows that the value of the program counter 103 is "0" (PC=0), the main routine address is indefinite and the refresh routine address is "0".

In pattern generation cycle 2, the value of the program counter 103 is PC=1 and, as the result of execution of step SP1 (PC=0) of the main routine, the main routine address is "0" (the initial address).

In pattern generation cycle 3, the value of the program counter 103 is PC=1 and, as the result of execution of step SP2 (PC=1) of the main routine, the main routine address is added with a 1 and hence is "2".

Thereafter, the above-described operation is repeated to write logic "0" in all the addresses from "0" through "63" until a pattern generation cycle 65 is initiated; that is, the routine L1 in FIG. 9A is executed.

In the illustrated example, since the main routine address of the memory DUT (DRAM) starts at "0" and ends in "63", the first address is "0" and the last address "63". As regards the pattern generation cycle, the pattern generation cycle 2 corresponds to the main routine address "0", and consequently, the pattern generation cycle 65 corresponds to the main routine address "63". Accordingly, the routine L2 starts with the next pattern generation cycle 66 and executes steps SP4 to SP6.

In the routine L2, steps SP4 and SP5 are repeatedly performed until the main routine address reaches the last address "63" as described above. Hence, the value PC of the program counter 103 alternates between 2 (PC=2) and 3 (PC=3).

The FIG. 11 example shows the case where the timer 106 issues an interrupt signal in the pattern generation cycle 70, and consequently in this pattern generation cycle the branch instruction J is provided from the synchronization circuit 108 to the decode/select part 109. Responding to the branch instruction, the decode/select part 109 sets, in the program counter 103, the value 10 in the branch address storage register 105 as a value that the program counter 103 is to take in the next pattern generation cycle. At the same time, the value that the program counter 103 is to output when the pattern generating operation returns from the refresh to the main routine, i.e. "3" in this example, is stored in the return address storage register 110.

Thus, as shown in FIG. 11, the program counter 103 outputs a value 10 (PC=10) in a pattern generation cycle 71 that is the first pattern generation cycle after the pattern generating operation proceeds to the refresh routine. Furthermore, as shown in FIG. 11, the program counter 103 outputs a value 3 (PC=3) in a pattern generation cycle 87 which is the first pattern generation cycle after the pattern generating operation returns to the main routine.

In the refresh routine, the value PC of the program counter 103 remains at PC=10 and the main routine address is fixed at "2" but the refresh routine address is incremented one by one. Since the number of addresses that are refreshed at one time is 16 in this example, the refresh routine ends when it is executed 16 times, and the operation returns to the main routine.

When the operation returns to the main routine, the value PC of the program counter 103 is set at 3 stored in the return address storage register 110 and in a pattern generation cycle 87 that is the first pattern generation cycle after the operation returns to the main routine, the program counter 103 outputs a value "3" (PC=3) as shown in FIG. 11. Thus, step SP5 is performed in the pattern generation cycle 87.

From the above it will be understood that the pattern generator 11 shown in FIG. 10 is capable of performing the main and refresh routines alternately and operates normally.

Further, in the case of generating high-speed pattern data through the use of plural such pattern generators as shown in FIG. 7, they cannot be operated correctly or normally for the reasons given below.

For example, in the case where two pattern generators 11A and 11B are disposed side by side as depicted in FIG. 7 so that they generate the pattern data PA (A1, A2, A3, ...) and PB (B1, B2, B3, ...) shown in FIGS. 8C and 8D which are combined to obtain a high-speed pattern data in the high-speed conversion part 16, synchronization circuits 108A and 108B of the pattern generators 11A and 11B issue branch instructions JA and JB in different pattern generation cycles, resulting in the pattern generators 11A and 11B proceeding from the main to the refresh routine at different timings.

FIG. 12 shows an example of the foregoing. Assume that each of the pattern generators 11A and 11B is one that, in response to the branch instruction issued during execution of the main routine of the pattern generating operation, proceeds therefrom to the refresh routine to refresh the DRAM under test and, upon completion of the refresh operation, returns to the main routine for the pattern generating operation as described previously with reference to FIG. 10. FIG. 12 shows the case where when the two pattern generators 11A and 11B are operated, the timer (106A) of the pattern generator 11A generates an interrupt signal in the pattern generation cycle 36, but the timer (106B) of the pattern generator 11B earlier generates an interrupt signal in the pattern generation cycle 34. That is, in the pattern generator 11A the branch instruction JA is issued from the synchronization circuit 108A during execution of the pattern generation cycle 36, whereas in the pattern generator 11B the branch instruction JB is issued from the synchronization circuit 108B during execution of the pattern generation cycle 34.

Even if the timers of the pattern generators 11A and 11B are exactly identical in construction, their measurements of time often differ due to unevenness of or variations in characteristics of the components or parts constituting each timer or the like. As a result, there occurs such a disadvantage as shown in FIG. 12.

As mentioned above, when the branch instructions JA and JB are issued at different timings or time points, the situation arises where although the pattern generator 11A is generating pattern data for the execution of the main routine, the other pattern generator 11B is already generating pattern data for the refresh routine, resulting in a drawback that the correlation is lost between the pattern data.

SUMMARY OF THE INVENTION

It is therefore an object of the present invention to provide a semiconductor memory testing apparatus which has a plurality of pattern generators each capable of executing the refresh routine and in which high-speed pattern data can be obtained by operating the pattern generators in normal condition.

In accordance with the present invention, the above object is attained by providing a semiconductor memory testing apparatus which comprises: a sequence control part for controlling a sequence of pattern generation; a plurality of pattern generation parts each controlled under said sequence control part; and a high-speed conversion part for multiplexing pattern data outputted from each of said plurality of pattern generation parts to obtain a high-speed pattern signal.

In a first preferred embodiment, the semiconductor memory testing apparatus further comprises waveform shaping means for converting the high-speed pattern signal outputted from said high-speed conversion means into a high-speed pattern signal having real waveforms, and high-speed logical comparison means for logically comparing the output signal read out of a semiconductor memory under test and the high-speed pattern signal outputted from said high-speed conversion means.

In a second preferred embodiment, the semiconductor memory testing apparatus further comprises waveform shaping means for converting the high-speed pattern signal outputted from said high-speed conversion means into a high-speed pattern signal having real waveforms, low-speed conversion means for converting the output signal read out of a semiconductor memory under test into a plurality of low-speed signals each having the same rate as that of the pattern data outputted from the corresponding one of said plurality of pattern generation parts, and a plurality of logical comparison means for logically comparing the plurality of low-speed signals outputted from said low-speed conversion means with expected value signals outputted from said plurality of pattern generation parts, respectively.

The semiconductor memory under test is a DRAM which is required to carry out a refresh operation, and a main routine for testing a semiconductor memory under test is started with preset different main routine addresses of the semiconductor memory under test. Also, a refresh routine for periodically refreshing the semiconductor memory under test is started with preset different refresh routine addresses of the semiconductor memory under test.

In the present invention, a plurality of pattern generation parts are controlled by a common sequence control part to generate a plurality of pattern data, which are converted by a high-speed conversion part to obtain a series of pattern data having a high frequency, namely, a high-speed pattern data, which is then converted by a waveform shaping circuit to a high-speed pattern signal for application to the semiconductor memory under test.

Since the plural pattern generation parts are controlled by the single common sequence control part, there is no fear that the correlation between the contents of control instructions issued to the pattern generation parts does not hold.

BRIEF DESCRIPTION OF THE DRAWINGS

FIGS. 9A and 9B are a flowchart for explaining the outline of an example of a program for operating the conventional semiconductor memory testing apparatus of FIG. 7;

DETAILED DESCRIPTION OF THE PREFERRED EMBODIMENT

Referring now to FIGS. 1 through 5, an embodiment of the present invention will be described in detail.

Figure 1:
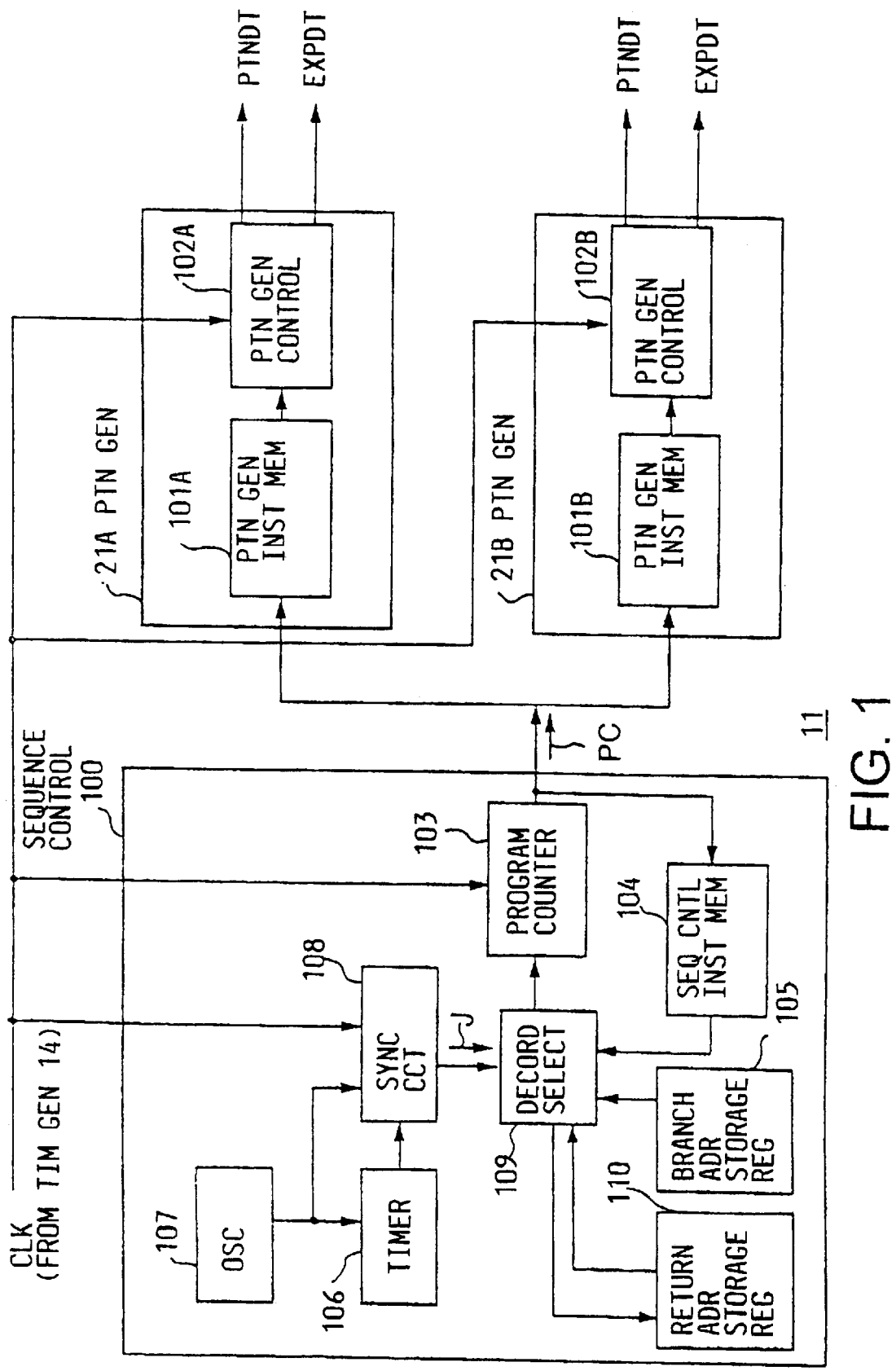
FIG. 1 is a block diagram illustrating a concrete example of a preferred high-speed pattern generator for use in the semiconductor memory testing apparatus according to the present invention.

FIG. 1 illustrates in block form a specific operative example of a high-speed pattern generator for use in an embodiment of the semiconductor memory testing apparatus according to the present invention. FIG. 2 is a flowchart showing the outline of an example of the program for operating the high-speed pattern generator shown in FIG. 1.

Figure 7:
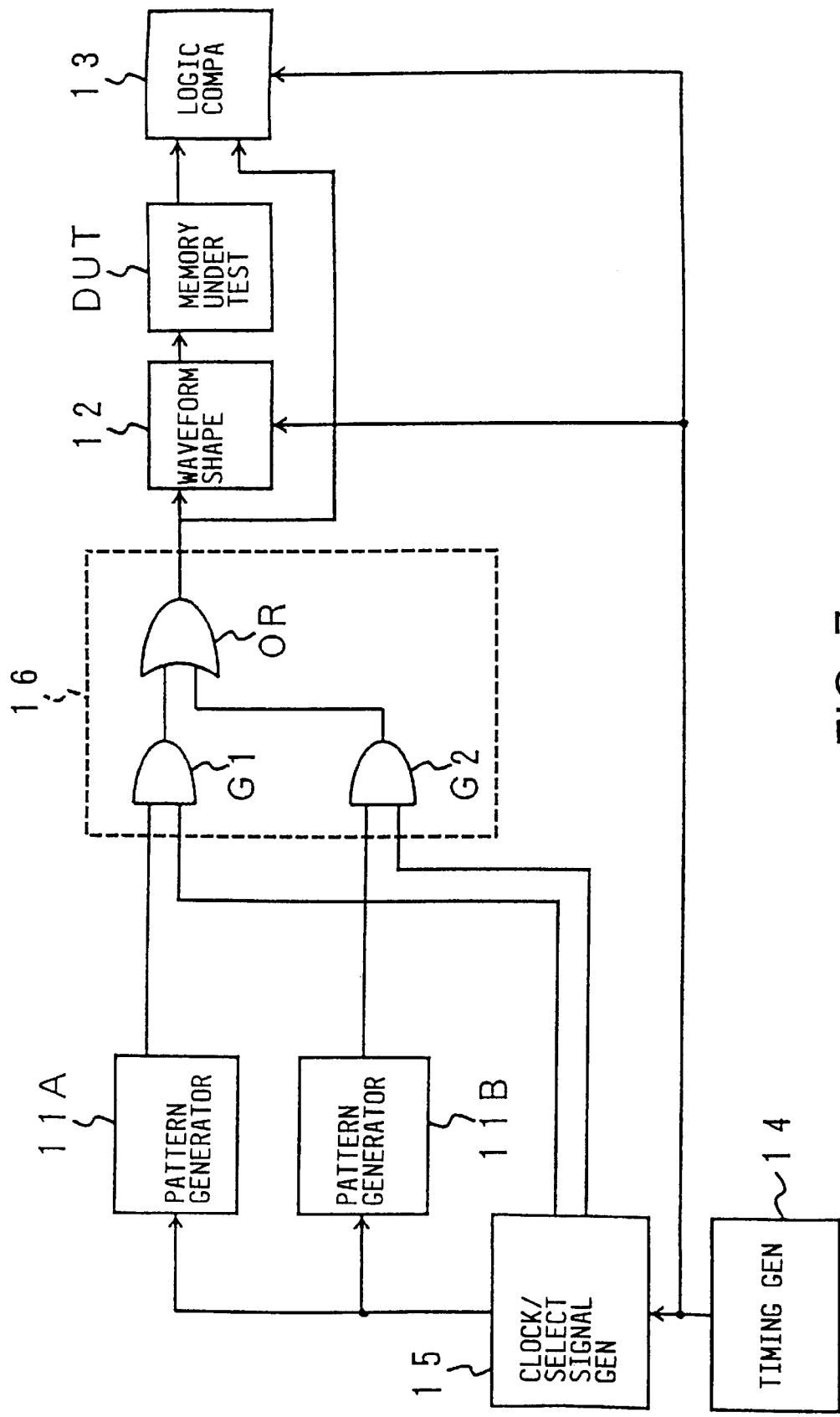
FIG. 7 is a block diagram schematically showing an example of a conventional semiconductor memory testing apparatus which is provided with plural pattern generators.
Figure 8:
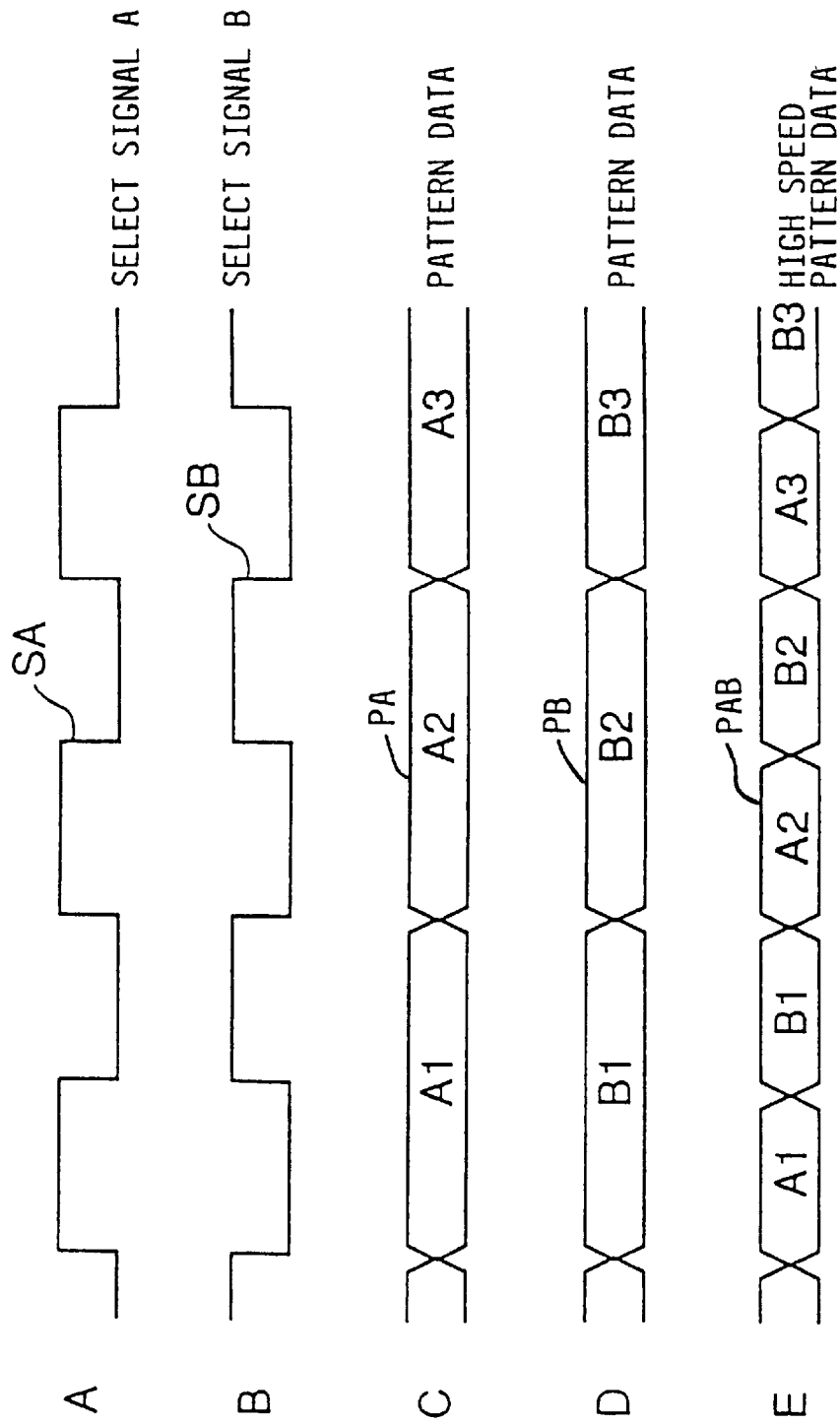
FIG. 8 is a waveform diagram for explaining the operation of the conventional semiconductor memory testing apparatus shown in FIG. 7.
Figure 9B:
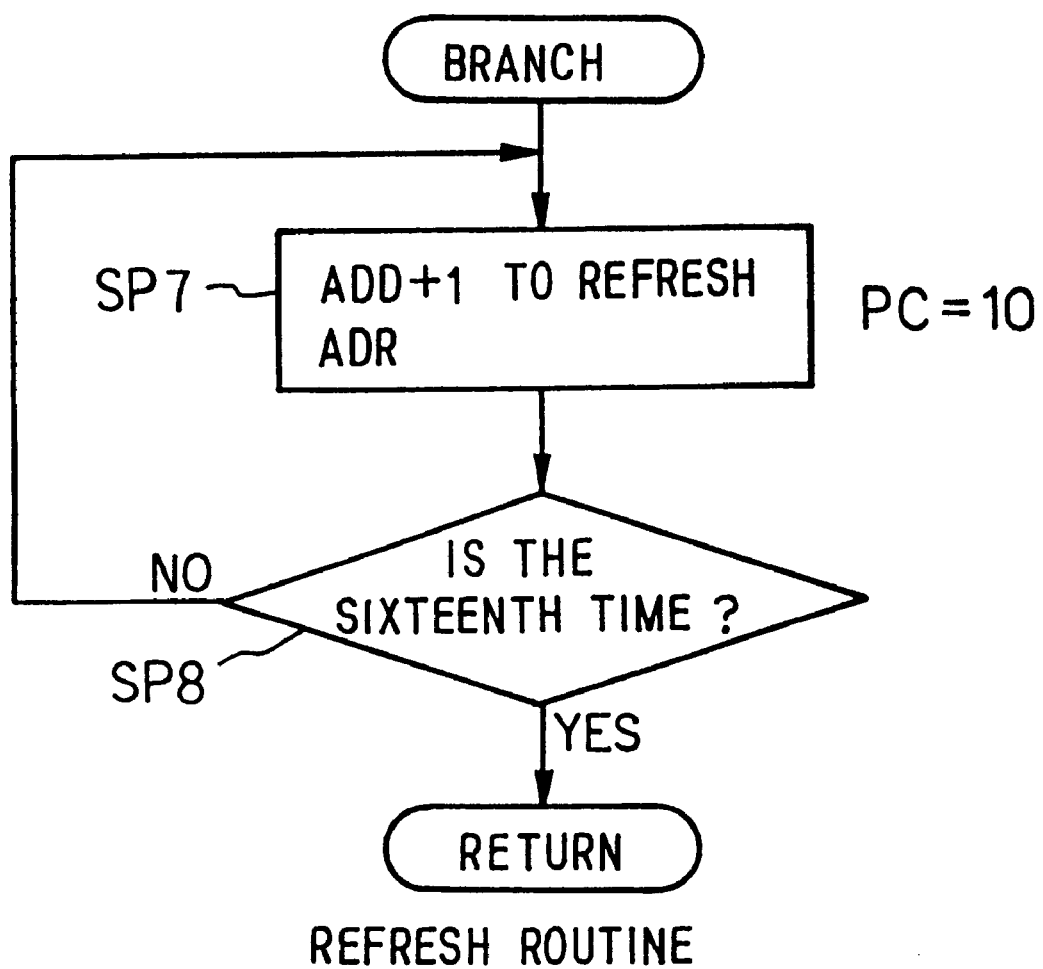
Figure 10:
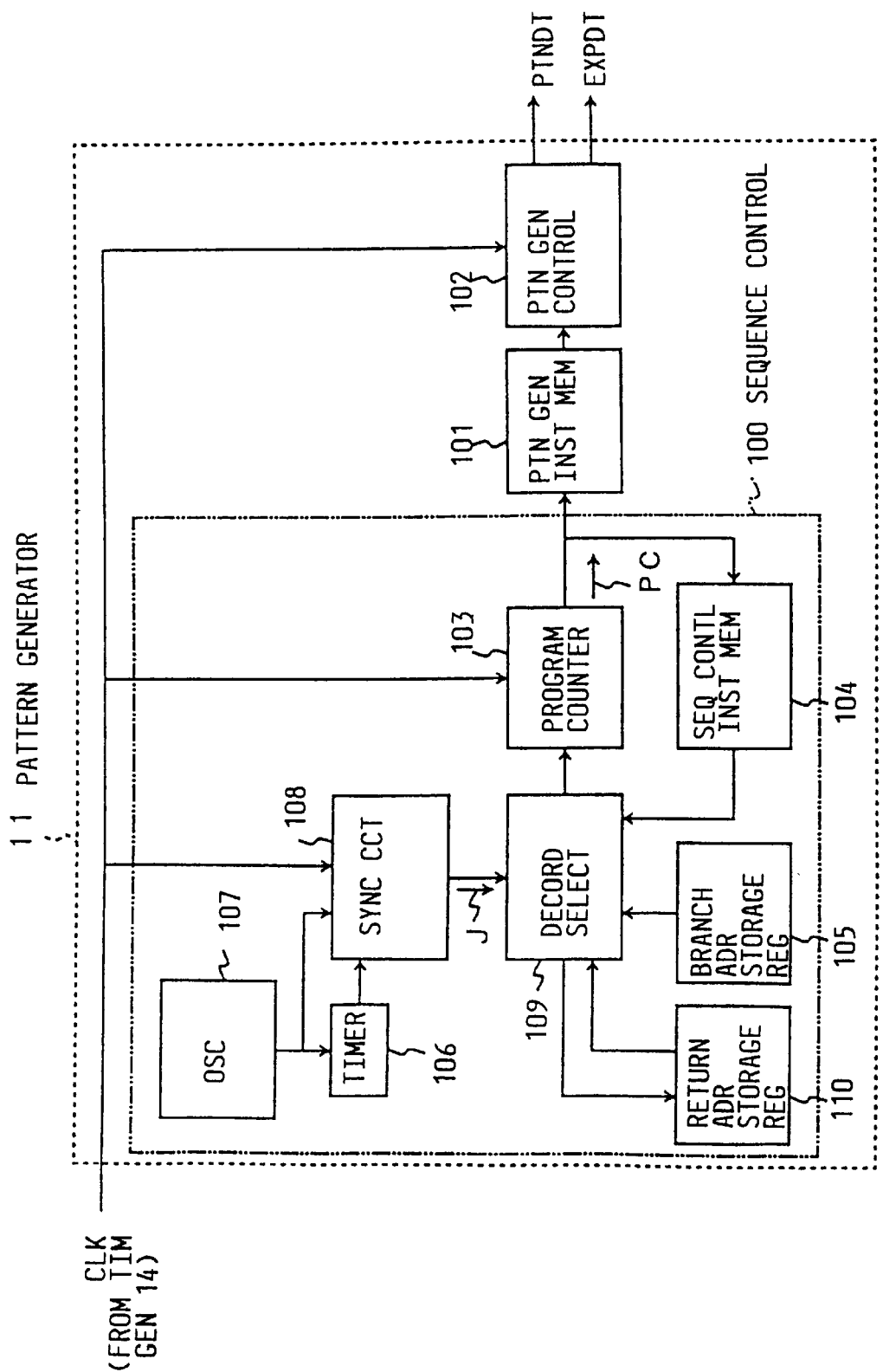
FIG. 10 is a block diagram illustrating a concrete example of a pattern generator preferable for use in the conventional semiconductor memory testing apparatus of FIG. 7.
Figure 11:
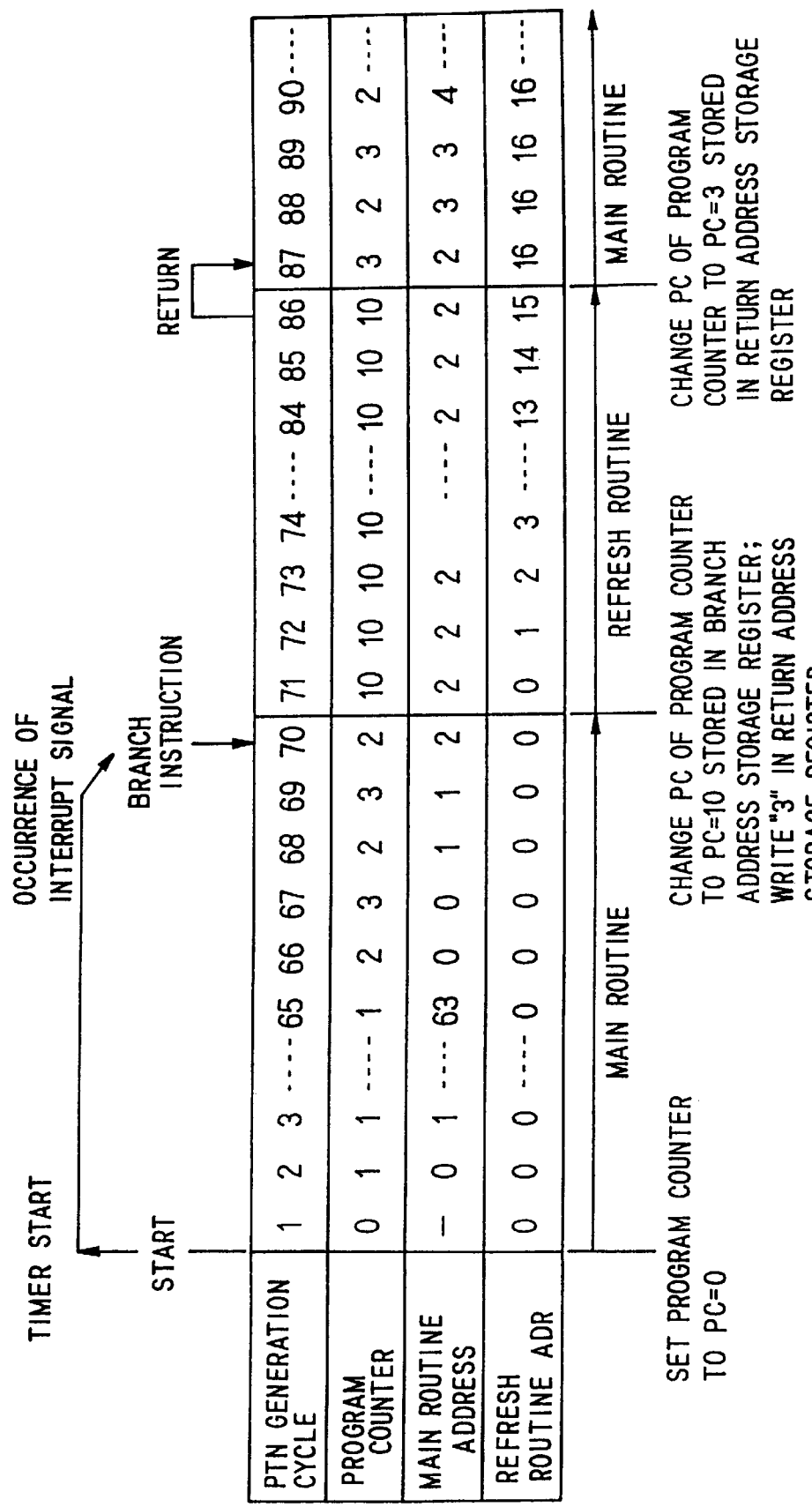
FIG. 11 is a diagram for explaining the relationships among a pattern generation cycle, a program counter value, a main routine address and a refresh routine address in the case of operating the conventional semiconductor memory testing apparatus under the control of the program depicted in FIG. 9.
Figure 12:
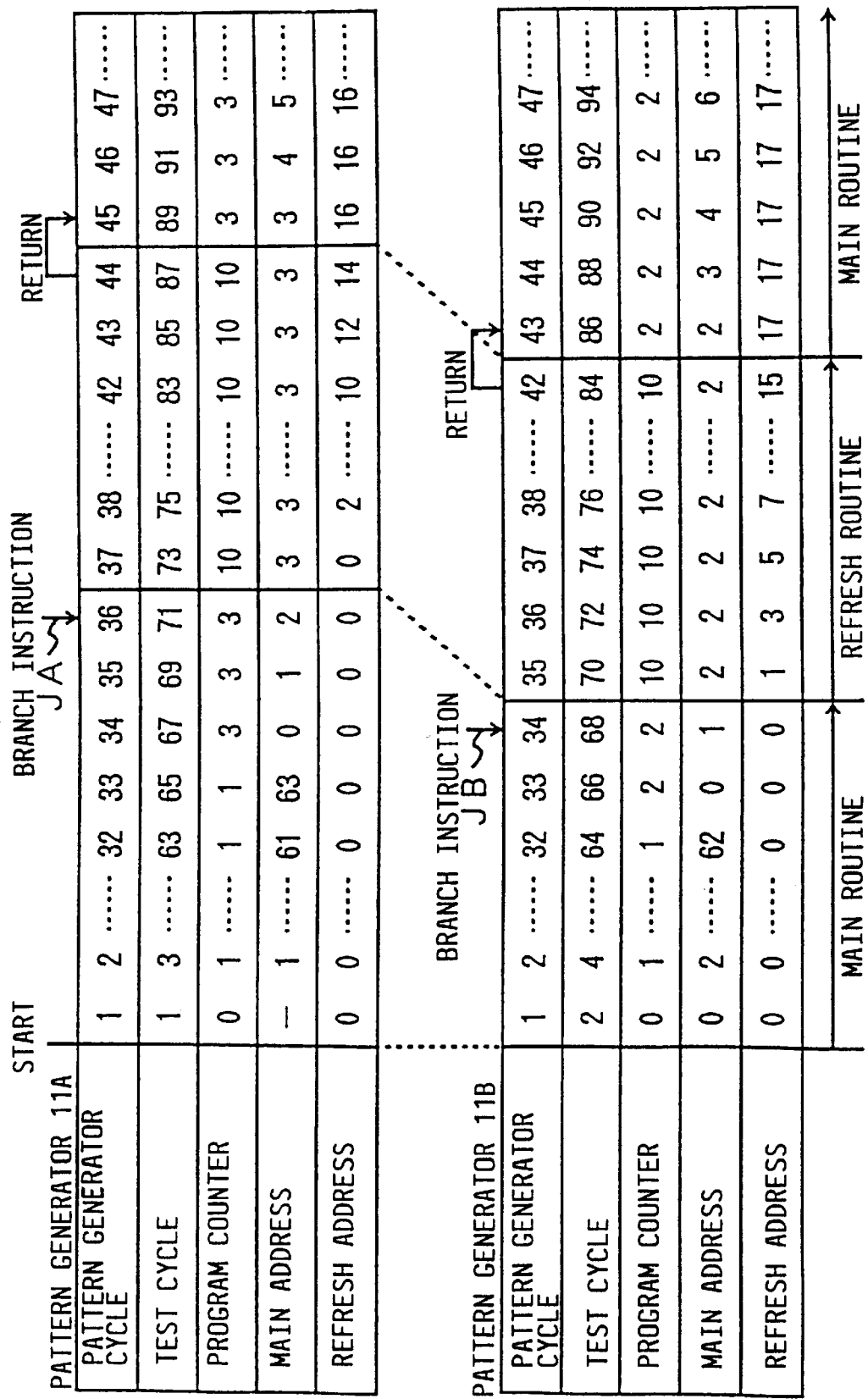
FIG. 12 is a diagram for explaining a disadvantage that is caused by the conventional pattern generator of FIG. 10.

As depicted in FIG. 1, according to the present invention, a sequence control part 100 that is one of constituents of the pattern generator 11 is used in common to a plurality of pattern generation parts, two pattern generation parts 21A and 21B in this example, thereby to commonly control the plurality of pattern generation parts 21A and 21B by the single sequence control part 100. In FIG. 1 the parts or components corresponding to those in FIG. 7 are identified by the same reference numerals and no description will be repeated unless required.

The pattern generation parts 21A and 21B comprise pattern generating instruction memories 101A and 101B, and pattern generation control parts 102A and 102B, respectively. The pattern generation control parts 102A and 102B output the pattern data PTNDT and the expected value pattern data EXPDT in response to the pattern generating instructions which are read out of the pattern generating instruction memories 101A and 101B, respectively, in accordance with the following step to be executed (the value of PC) indicated by the program counter 103 of the sequence control part 100.

Figure 2A:
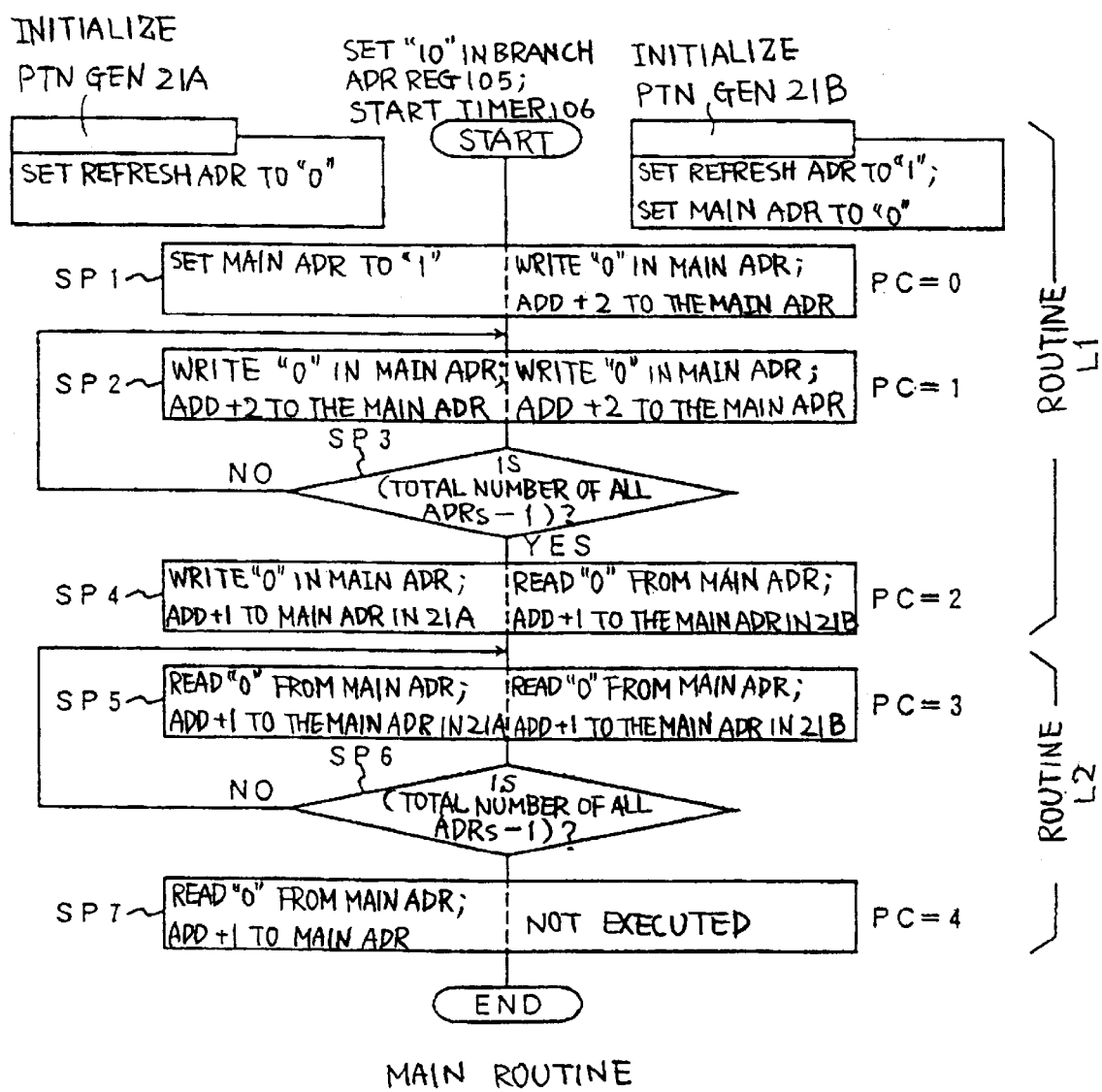
FIGS. 2A and 2B are a flowchart showing the outline of an example of a program for operating the high-speed pattern generator depicted in FIG. 1.
Figure 2B:
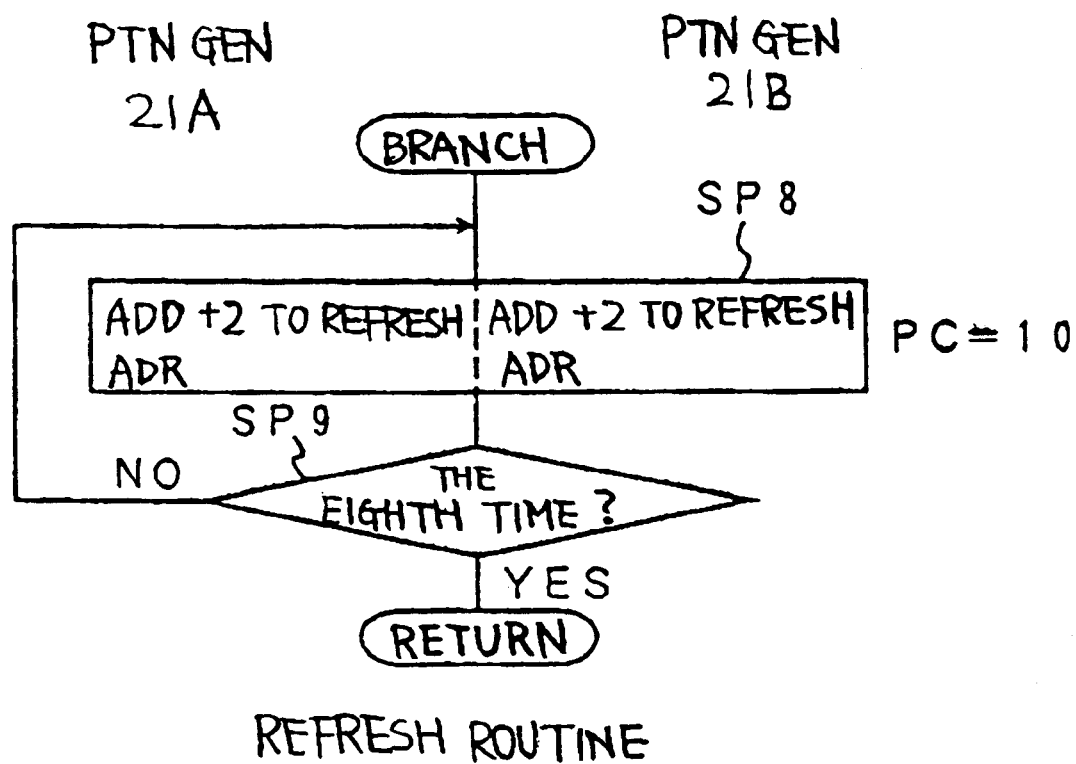
Figure 3:
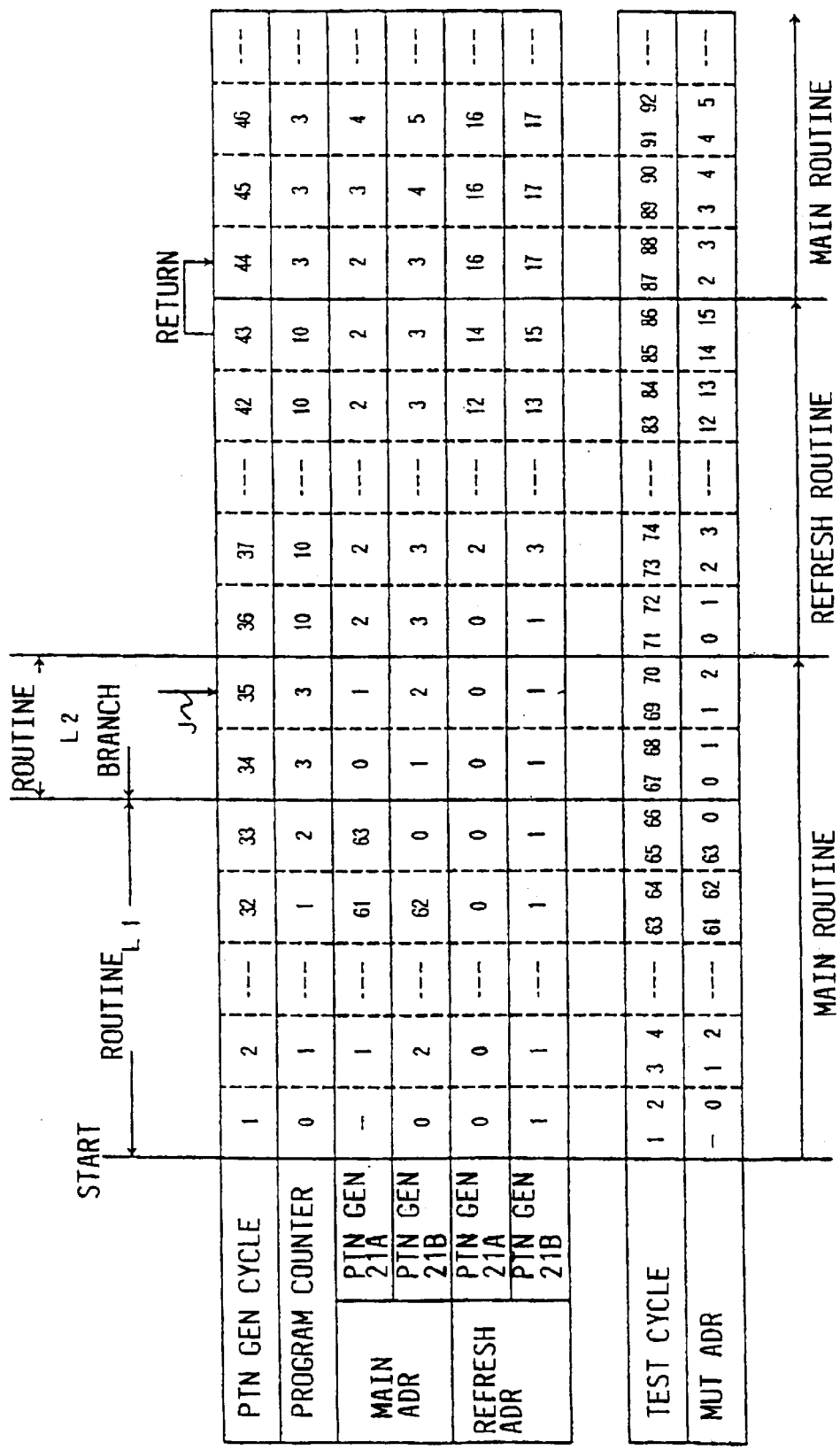
FIG. 3 is a diagram for explaining the operation of the high-speed pattern generator shown in FIG. 1.

In the main routine shown in FIG. 2, when the timer 106 measures a predetermined time period during the execution of the pattern generation cycle 35 as shown in FIG. 3, for example, a branch instruction J is inputted to the decode/select part 109 from the synchronization circuit 108. As a result, the decode/select part 109 inputs to the program counter 103 a value 10 (PC=10) stored in the branch address storage register 105, thereby changing the value PC to be indicated by the program counter 103 at the next pattern generation cycle to PC=10.

When the value PC of the program counter 103 is PC=10, the sequence control part 100 performs step SP8 of the refresh routine shown in FIG. 2B. In the first branch operation, since the refresh address was set to "0" at the time of initialization in the pattern generation part 21A, the pattern data outputted from the pattern generation part 21A is written in the address "0" of the memory under test DUT to refresh it. After completion of the refresh operation, a "2" is added to the refreshed address "0" to set the next refresh address to address "2".

In the pattern generation part 21B, since the refresh address was set to "1" at the time of initialization, the pattern data outputted from the pattern generation part 21B is written in the address "1" of the memory under test DUT to refresh it. After completion of the refresh operation, a "2" is added to the refreshed address "1" to set the next refresh address to address "3".

When the step SP8 is repeated a predetermined times, in this example, eight times, the refreshed address reaches 16, and the number of times that the step SP8 has been repeated is detected in step SP9, and the program returns to the main routine shown in FIG. 2A when 16 is detected by the step SP9.

As described above, if the branch instruction J was issued in the pattern generation cycle 35, the pattern generation parts 21A and 21B perform the pattern generating instructions (step SP5) that are due to be executed in the pattern generation cycle 35, and thereafter the main routine branches to the refresh routine of FIG. 2B to execute the refresh operation.

Moreover, when the operation returns to the main routine from the refresh routine, the main routine addresses to be next started are retained such that the main routine is to be started with the address "2" in the pattern generation part 21A and with the address "3" in the pattern generation part 21B after the pattern generation cycle 35 has been performed, and further, PC=3 is stored in the return address storage register 110. Consequently, in the pattern generation cycle 44 when the operation is returned back to the main routine, PC=3 is outputted from the program counter 103. Accordingly, the main routine is started with the addresses "2" and "3" of the memory under test DUT and hence the afore-mentioned correlation is held.

Figure 4:
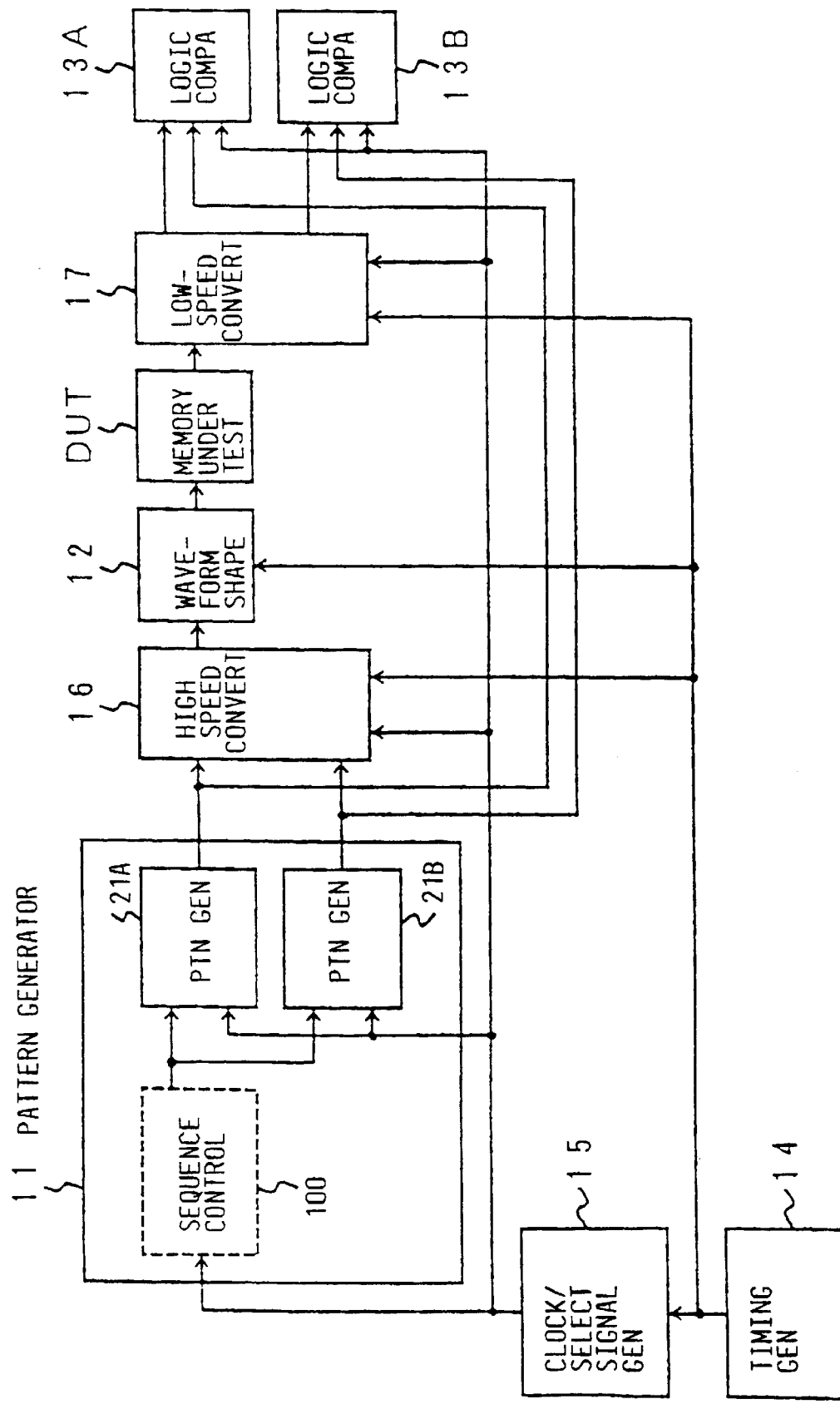
FIG. 4 is a block diagram schematically illustrating an embodiment of the semiconductor memory testing apparatus according to the present invention which employs the high-speed pattern generator of FIG. 1.
Figure 5:
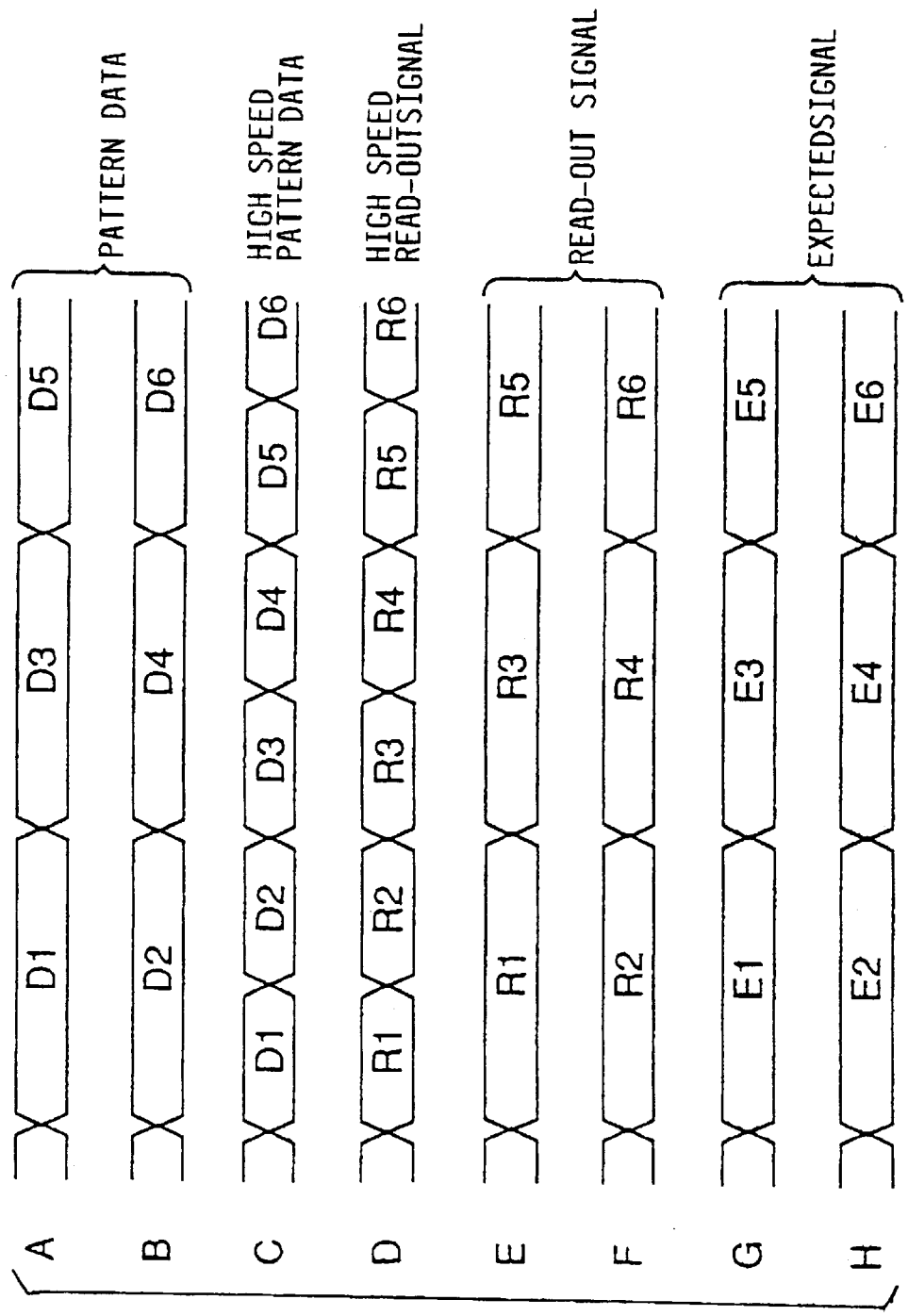
FIG. 5 is a waveform diagram for explaining the operation of the semiconductor memory testing apparatus of FIG. 4.
Figure 6:
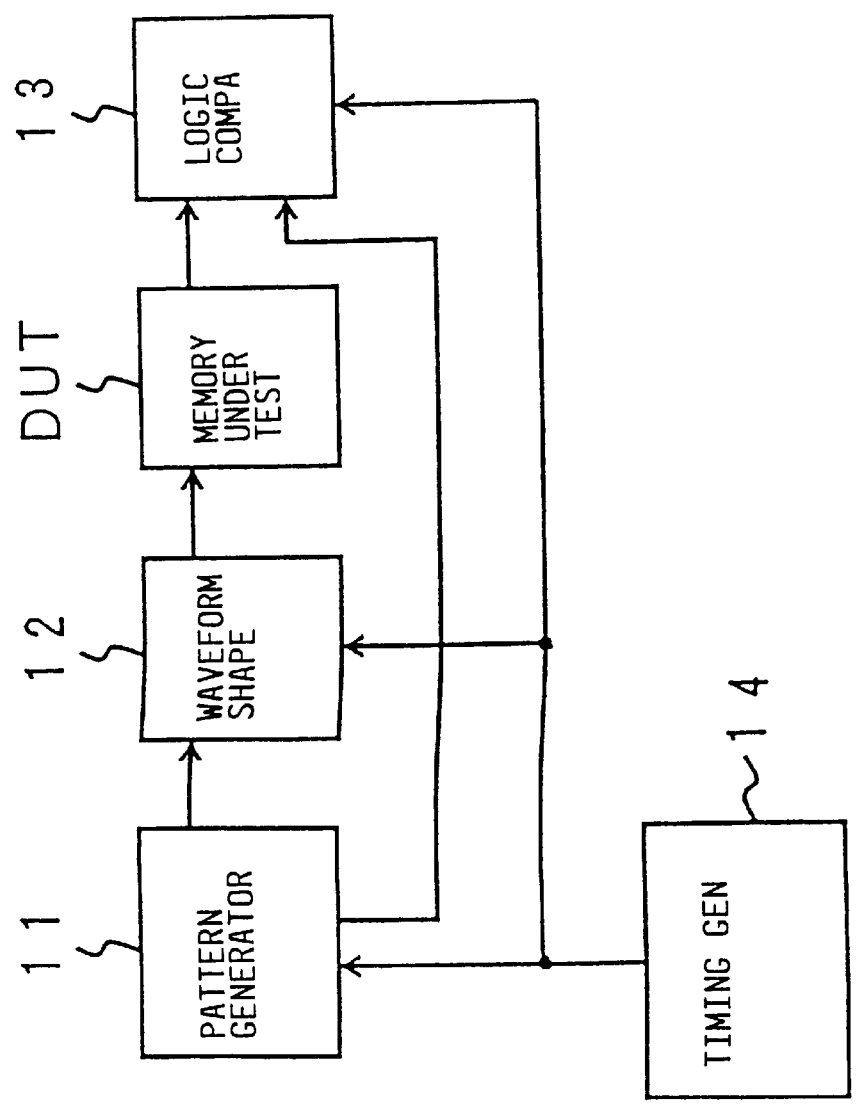
FIG. 6 is a block diagram schematically showing an example of a conventional semiconductor memory testing apparatus.

FIG. 4 illustrates in block form the general configuration of a semiconductor memory testing apparatus according to the present invention which employs the high-speed pattern generator shown in FIG. 1. In FIG. 4 the components or parts corresponding to those in FIG. 7 are identified by the same reference numerals. The pattern generator 11 has the pattern generation parts 21A and 21B as discussed previously with respect to FIG. 1, which generate pattern data D1, D3, D5, . . . and D2, D4, D6, . . . shown in FIGS. 5A and 5B, respectively.

The pattern data D1, D3, D5, . . . and D2, D4, D6, . . . are converted by the high-speed conversion part 16 to obtain a high-speed pattern data D1, D2, D3, D4, D5, . . . having a frequency of twice that of the pattern data, as shown in FIG. 5C. The high-speed pattern data D1, D2, D3, D4, D5, . . . are inputted to the waveform shaping part 12 where they are converted to a high-speed pattern signal having real waveforms (in analog form), which in turn are applied to the memory under test DUT to be written therein.

The memory under test DUT is read out at the same rate or speed as that of writing therein, and hence a high-speed read-out signal R1, R2, R3, R4, R5, . . . shown in FIG. 5D is outputted from the memory under test DUT. The high-speed read-out signal R1, R2, R3, R4, . . . is converted by a low-speed conversion part 17 into two low-speed read-out signals R1, R3, R5, . . . and R2, R4, R6, . . . shown in FIGS. 5E and 5F, respectively, which in turn are supplied to logical comparison parts 13A and 13B, respectively.

The logical comparison parts 13A and 13B are supplied with low-speed expected value signals (expected value pattern data) E1, E3, E5, . . . and E2, E4, E6, . . . shown in FIGS. 5G and 5H, respectively, from the corresponding ones of the two pattern generation parts 21A and 21B of the pattern generator 11, for logical comparison with the above-mentioned low-speed read-out signals R1, R3, R5, . . . and R2, R4, R6, . . . .

This embodiment has been described to use the two logical comparison parts 13A and 13B, but the logical comparison could also be made by one high-speed logical comparison part which operates at high speed or rate as in the case of FIG. 7. In such an instance, the low-speed conversion part 17 is unnecessary and the high-speed pattern data (FIG. 5C) obtained from the high-speed conversion part 16 can be used as the expected value signal.

While in the above the two pattern generation parts 21A and 21B are shown to be controlled by the common single sequence control part 100, more than two pattern generation parts can be used. The larger the number of the pattern generation parts, the faster or higher in speed the pattern generator can be obtained.

As described above, the present invention is arranged such that the common single sequence control part 100 is used to control a plurality of pattern generation parts 21A and 21B to generate a plurality of pattern data, followed by being converted to a high-speed pattern data. Accordingly, when each of the pattern generation parts 21A and 21B receives the branch instruction J outputted from the synchronization circuit 108 in accordance with an instruction from the timer 106, the pattern generation parts 21A and 21B receive it during executing the same pattern generation cycle, and start the refresh operation. Consequently, the correlation between the pattern data generated from the plurality of the pattern generation parts 21A and 21B is correctly held, ensuring the generation of continuous pattern data.

Thus, according to the present invention, there is obtained an advantage that a desired high-speed pattern signal can be generated by operating a plurality of pattern generators in normal condition, each being capable of executing the refresh routine.

It will be apparent that many modifications and variations may be effected without departing from the scope of the novel concepts of the present invention.

What is claimed is:

1. A semiconductor memory testing apparatus comprising:

a timing generation part generating an operation clock;

a sequence control part controlling a sequence of pattern generation;

a clock/select signal generating part, coupled to the timing generation part and to the sequence control part, generating a ½ operation clock having a frequency of ½ of that of the operation clock and two select signals each having a ½ logical high duration period followed by a ½ logical low duration period with a phase difference of ½ period of that of the ½ operation clock from each other;

two pattern generation parts each coupled to said clock/select signal generating part and each coupled to and controlled by said sequence control part and responsive to a respective one of the two select signals supplied from said clock/select signal generating part generating pattern data and expected pattern data, respectively; and high-speed conversion means for multiplexing the pattern data and expected pattern data outputted from each of said pattern generation parts to obtain a high-speed pattern signal and a high-speed expected pattern signal.

2. The semiconductor memory testing apparatus according to claim 1, further comprising:

waveform shaping means for converting the high-speed pattern signal outputted from said high-speed conversion means into a high-speed pattern signal having real waveforms to be applied to a semiconductor memory under test; and high-speed logical comparison means for logically comparing the output signal read out of the semiconductor memory under test and the high-speed expected pattern signal outputted from said high-speed conversion means.

3. The semiconductor memory testing apparatus according to claim 1, further comprising:

waveform shaping means for converting the high-speed pattern signal outputted from said high-speed conversion means into a high-speed pattern signal having real waveforms;

low-speed conversion means for converting the output signal read out of a semiconductor memory under test into a plurality of low-speed signals each having the same rate as that of the pattern data outputted from the corresponding one of said two pattern generation parts; and two logical comparison means for logically comparing the two low-speed signals outputted from said low-speed conversion means with the two expected pattern signals outputted from said two pattern generation parts, respectively.

4. The semiconductor memory testing apparatus according to claim 1, wherein the semiconductor memory testing apparatus tests a semiconductor memory under test and the semiconductor memory under test is a DRAM which requires a refresh operation to be carried out by the semiconductor memory testing apparatus, and a main routine for testing a semiconductor memory under test is applied to the semiconductor memory under test and started with preset different main routine addresses of the semiconductor memory under test.

5. The semiconductor memory testing apparatus according to claim 1, wherein the semiconductor memory testing apparatus tests a semiconductor memory under test and the semiconductor memory under test is a DRAM which requires a refresh operation to be carried out by the semiconductor memory testing apparatus, and the refresh operation includes a refresh routine periodically refreshing the semiconductor memory under test, said refresh routine being started with preset different refresh routine addresses of the semiconductor memory under test.

6. A semiconductor memory testing apparatus comprising:

a timing generating part generating an operation clock;

a sequence control part controlling a sequence of pattern generation;

M pattern generation parts, each coupled to the sequence control part, in which M is an integer greater than or equal to 2, and each commonly controlled by said sequence control part;

a clock/select signal generating part, coupled to the timing generating part, to the sequence control part, and to each of the M pattern generation parts, said clock/select signal generating part generating a 1/M operation clock having a frequency of 1/M of that of the operation clock which is to be supplied to said M pattern generation parts commonly and M select signals each having a 1/M logical high duration period with a phase difference of a period of the operation clock from each other, wherein each of said M pattern generation parts comprising a pattern generating instruction memory to which specific instructions to be executed are prestored and which is responsive to an address of an instruction to be executed supplied from said sequence control part for outputting a pattern generating instruction and a pattern generation control part responsive to said 1/M operation clock supplied from said clock/select signal generating part for generating a pattern data in accordance with the pattern generating instruction having a period M times longer than that of the operation clock, respectively;

high-speed conversion means responsive to the M select signals supplied from said clock/select signal generating part for multiplexing respective said M pattern data outputted from respective said M pattern generation parts, to thereby output a high-speed pattern signal having a frequency M times higher than that of respective said M pattern data;

waveform shaping means for converting the high-speed pattern signal outputted from said high-speed conversion means into a high-speed pattern signal having a real waveform; and high-speed logical comparison means for logically comparing the output signal read out of a semiconductor memory under test and the high-speed pattern signal outputted from said high-speed conversion means as an expected value signal.

7. The semiconductor memory testing apparatus according to claim 6, wherein the semiconductor memory under test is a DRAM which requires a refresh operation to be carried out by the semiconductor memory testing apparatus, and a main routine for testing a semiconductor memory under test is applied to the semiconductor memory under test and started with preset different main routine addresses of the semiconductor memory under test.

8. A semiconductor memory testing apparatus comprising:

a timing generating part generating an operation clock;

a sequence control part controlling a sequence of pattern generation;

a plurality of pattern generation parts whose number is M where M is an integer equal to or more than 2, each coupled to and controlled by said sequence control part;

a clock/select signal generating part, coupled to said timing generation part, to said sequence control part, and to said plurality of pattern generation parts, generating a 1/M operation clock having a frequency divided into 1/M of the operation clock and M select signals each having a 1/M logical high duration period with a phase difference of a period of said operation clock from each other, wherein each of said M pattern generation parts comprises a pattern generating instruction memory to which specific instructions to be executed are prestored and which is responsive to an address of an instruction to be executed supplied from said sequence control part for outputting a pattern generating instruction specific to each of said M pattern generation parts and a pattern generation control part responsive to said 1/M operation clock supplied from said clock/select signal generating part for generating in accordance with the pattern generating instruction supplied from the pattern generating instruction memory a pattern data and expected pattern data each having a period M times longer than that of the operation clock, respectively;

high-speed conversion means responsive to the select signals from said clock/select signal generating part for multiplexing said M pattern data outputted from said respective M pattern generation parts to thereby output a high-speed pattern signal having a frequency M times higher than that of respective said M pattern data;

waveform shaping means for converting the high-speed pattern signal outputted from said high-speed conversion means into a high-speed pattern signal having a real waveform which is supplied to a semiconductor memory under test;

low-speed conversion means responsive to the select signals for converting the output signal read out of the semiconductor memory under test into M low-speed signals, each having the same rate as that of the pattern data outputted from the corresponding one of said M pattern generation parts; and M logical comparison means each for logically comparing each of the M low-speed signals outputted from respective said M low-speed conversion means with each of the M expected pattern signals outputted from respective said M pattern generation parts, respectively.

9. The semiconductor memory testing apparatus according to claim 8, wherein the semiconductor memory under test is a DRAM which is required to carry out a refresh operation, and a refresh routine for periodically refreshing a semiconductor memory under test is started with preset different refresh routine addresses of the semiconductor memory under test.

10. The semiconductor memory testing apparatus according to claim 6, wherein each of said pattern generation parts comprises:

a pattern generating instruction memory, and a pattern generation control part coupled to the pattern generating instruction memory.

11. The semiconductor memory testing apparatus according to claim 6, wherein the semiconductor memory under test is a DRAM which requires a refresh operation to be carried out by the semiconductor memory testing apparatus, wherein said sequence control part comprises:

a program counter indicating a value PC of the instruction to be executed for performing the sequence of pattern generation, a sequence control instruction memory responsive to the value PC of the program counter for outputting sequence control instructions to determine the sequence of pattern generation, a branch instruction part generating in synchronism with the operation clock a branch instruction for instructing a periodic performance of a branch routine of the refresh operation at every certain period of time predetermined in respect of the semiconductor memory under test, a branch address storage register for storing a value PC which is to be indicated by the program counter when a first step of the branch routine is executed;

a return address storage register, and a decode/select part determining the value PC of the program counter for the next pattern generation cycle by interpreting instruction read out of the sequence control instruction memory, said decode/select part:

setting the value PC of the program counter for the next pattern generation cycle at the value stored in the branch address register upon receipt of the branch instruction from the branch instruction part regardless of instruction from the sequence control instruction memory;

storing into the return address storage register the value PC which the program counter ought to indicate in the next pattern generation cycle without being interrupted by the branch instruction; and setting also the value PC of the program counter for the next pattern generation cycle at the value stored in the return address storage register upon termination of the branch routine, and wherein the pattern generating instruction memory of each of said M pattern generation parts is responsive to the value PC of the instruction to be executed applied from the program counter for outputting a pattern generating instruction.

12. The semiconductor memory testing apparatus according to claim 2, wherein the semiconductor memory under test is a DRAM which requires a refresh operation to be carried out by the semiconductor memory testing apparatus, and a main routine for testing a semiconductor memory under test is applied to the semiconductor memory under test and started with preset different main routine addresses of the semiconductor memory under test.

13. The semiconductor memory testing apparatus according to claim 2, wherein the semiconductor memory under test is a DRAM which requires a refresh operation to be carried out by the semiconductor memory testing apparatus, and the refresh operation includes a refresh routine periodically refreshing the semiconductor memory under test, said refresh routine being started with preset different refresh routine addresses of the semiconductor memory under test.

14. The semiconductor memory testing apparatus according to claim 3, wherein the semiconductor memory under test is a DRAM which requires a refresh operation to be carried out by the semiconductor memory testing apparatus, and a main routine for testing a semiconductor memory under test is applied to the semiconductor memory under test and started with preset different main routine addresses of the semiconductor memory under test.

15. The semiconductor memory testing apparatus according to claim 3, wherein the semiconductor memory under test is a DRAM which requires a refresh operation to be carried out by the semiconductor memory testing apparatus, and the refresh operation includes a refresh routine periodically refreshing the semiconductor memory under test, said refresh routine being started with preset different refresh routine addresses of the semiconductor memory under test.

16. The semiconductor memory testing apparatus according to claim 8, wherein each of said pattern generation parts comprises:

a pattern generating instruction memory, and a pattern generation control part coupled to the pattern generating instruction memory.

17. The semiconductor memory testing apparatus according to claim 8, wherein the semiconductor memory under test is a DRAM which requires a refresh operation to be carried out by the semiconductor memory testing apparatus, wherein said sequence control part comprises:

a program counter indicating a value PC of the instruction to be executed for performing the sequence of pattern generation, a sequence control instruction memory responsive to the value PC of the program counter for outputting sequence control instructions to determine the sequence of pattern generation, a branch instruction part generating in synchronism with the operation clock a branch instruction for instructing a periodic performance of a branch routine of the refresh operation at every certain period of time predetermined in respect of the semiconductor memory under test, a branch address storage register for storing a value PC which is to be indicated by the program counter when a first step of the branch routine is executed;

a return address storage register, and a decode/select part determining the value PC of the program counter for the next pattern generation cycle by interpreting instruction read out of the sequence control instruction memory, said decode/select part:

setting the value PC of the program counter for the next pattern generation cycle at the value stored in the branch address register upon receipt of the branch instruction from the branch instruction part regardless of instruction from the sequence control instruction memory;

storing into the return address storage register the value PC which the program counter ought to indicate in the next pattern generation cycle without being interrupted by the branch instruction; and setting also the value PC of the program counter for the next pattern generation cycle at the value stored in the return address storage register upon termination of the branch routine, and wherein the pattern generating instruction memory of each of said M pattern generation parts is responsive to the value PC of the instruction to be executed applied from the program counter for outputting a pattern generating instruction.

18. The semiconductor memory testing apparatus according to claim 8, wherein the semiconductor memory under test is a DRAM which requires a refresh operation to be carried out by the semiconductor memory testing apparatus, and a main routine for testing a semiconductor memory under test is applied to the semiconductor memory under test and started with preset different main routine addresses of the semiconductor memory under test.

19. The semiconductor memory testing apparatus according to claim 6, wherein the semiconductor memory under test is a DRAM which is required to carry out a refresh operation, and a refresh routine for periodically refreshing a semiconductor memory under test is started with preset different refresh routine addresses of the semiconductor memory under test.

* * * * *